United States Patent
Yu et al.

(10) Patent No.: US 6,403,500 B1
(45) Date of Patent: Jun. 11, 2002

(54) CROSS-SHAPED RESIST DISPENSING SYSTEM AND METHOD

(75) Inventors: James Jiahua Yu, Milpitas; Kouros Ghandehari, Santa Clara; Bhanwar Singh, Morgan Hill, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/760,241

(22) Filed: Jan. 12, 2001

(51) Int. Cl.[7] .................. H01L 21/31; H01L 21/469
(52) U.S. Cl. .................. 438/782; 438/778; 438/780; 427/96; 427/240
(58) Field of Search .................. 438/778, 780, 438/782; 427/96, 240

(56) References Cited

U.S. PATENT DOCUMENTS

| | | | |
|---|---|---|---|
| 4,416,213 A | 11/1983 | Sakiya | 118/52 |
| 5,254,367 A | 10/1993 | Matsumura et al. | 427/240 |
| 5,366,757 A | 11/1994 | Lin | 427/9 |
| 5,378,511 A | 1/1995 | Cardinali et al. | 427/600 |
| 5,571,560 A | 11/1996 | Lin | 427/240 |
| 6,017,585 A * | 1/2000 | Thomas | 427/240 |
| 6,027,760 A | 2/2000 | Gurer et al. | 427/8 |
| 6,139,636 A * | 10/2000 | Huang et al. | 118/320 |
| 6,238,747 B1 * | 5/2001 | Marinaro et al. | 427/425 |
| 6,248,175 B1 * | 6/2001 | Subramanian et al. | 118/712 |

* cited by examiner

Primary Examiner—Alexander G. Ghyka
(74) Attorney, Agent, or Firm—Foley & Lardner

(57) ABSTRACT

An exemplary method of depositing photoresist material on an integrated circuit wafer is described. This method can include providing a cross-shaped resist dispenser including a plurality of resist dispense nozzles; dispensing photoresist material through the plurality of resist dispense nozzles to an integrated circuit wafer; and rotating at least one of the cross-shaped resist dispenser and the integrated circuit wafer.

20 Claims, 2 Drawing Sheets

CROSS-SHAPED RESIST DISPENSING SYSTEM AND METHOD

CROSS REFERENCE TO RELATED APPLICATIONS

This application is related to U.S. application Ser. No. 09/760,243, filed Jan. 12, 2001, entitled DISC-SHAPED RESIST DISPENSING SYSTEM AND METHOD, filed by Yu et al. on the same day and assigned to the same assignee as this application.

FIELD OF THE INVENTION

The present specification relates generally to the field of integrated circuits and to methods of manufacturing integrated circuits. More particularly, the present specification relates to a cross-shaped resist dispensing system and method.

BACKGROUND OF THE INVENTION

Generally, conventional integrated circuit manufacturing processes involve the transfer of geometric shapes on a mask to the surface of a semiconductor wafer or layer above the semiconductor wafer. The semiconductor wafer corresponding to the geometric shapes, or corresponding to the areas between the geometric shapes, is etched away. The transfer of the shapes from the mask to the semiconductor wafer typically involves a lithographic process. Conventional lithographic processes include applying a pre-polymer solution to the semiconductor wafer, the pre-polymer being selected to form a radiation-sensitive polymer which reacts when exposed to ultraviolet light, electron beams, x-rays, or ion beams. The solvent in the pre-polymer solution is removed by evaporation resulting from baking the pre-polymer film on the wafer. The film is exposed to radiation, such as, ultraviolet light, through a photomask supporting the desired geometric patterns.

The images in the photosensitive material are then developed by soaking the wafer in a developing solution. The exposed or unexposed areas are removed in the developing process, depending on the nature of the radiation-sensitive material. Then, the wafer is placed in an etching environment which etches away the areas not protected by the radiation-sensitive material. Due to their resistance to the etching process, the radiation sensitive-materials are also known as photoresists.

The high cost of photoresist pre-polymer solutions makes it desirable to devise methods of improving the efficiency of the coating process to minimize the amount of the polymer solution required to coat a substrate. Furthermore, thickness uniformity of the photoresist layer is an important criterion in the manufacture of integrated circuits. When the radiation is focused through the mask onto the coating, variations in thickness of the coating prevent the precise focus of the radiation over the entire surface of the wafer. Such precision is necessary to ensure satisfactory reproduction of the geometric patterns on the semiconductor wafer. Moreover, high precision is particularly important for advanced circuits with line width dimensions approaching 0.25 micron line widths and smaller.

Photoresist is often deposited to a substrate, or more particularly a wafer, by means of forming a puddle followed by spinning (i.e., spin coating). A large puddle of photoresist covering more than half of the substrate area is applied via a dispenser that directs a steady flow of resist in liquid form. The thickness on the puddle is on the order of a millimeter. The substrate is then spun at a speed ranging from 1,000 to 10,000 RPM to thoroughly spread out and remove the excess resist. This spinning results in a film thickness on the order of between a fraction of micrometer and a few micrometers. Therefore, only a small percentage of the photoresist material actually remains on the substrate. Most of the photoresist material dispensed is wasted, resulting in high cost and waste disposal problems.

In conventional systems, photoresist deposition utilizes a single pipe or a nozzle to dispense or spray coat the photoresist. Use of a single pipe or nozzle for photoresist deposition on a spinning wafer is taught in numerous patents, such as, U.S. Pat. Nos. 4,416,213; 5,254,367; 5,366, 757; and 5,378,511. However, such conventional dispensing and spraying mechanisms use much more resist material than actually remains on the wafer. This inefficiency is costly, particularly due to the high cost of photoresist material.

Thus, there is a need to dispense photoresist material in a more efficient manner. Further, there is a need to dispense photoresist material that limits waste and increases uniformity of the dispensed photoresist material. Yet further, there is a need for a cross-shaped resist dispensing system and method.

SUMMARY OF THE INVENTION

An exemplary embodiment is related to a method of depositing photoresist material on an integrated circuit wafer. This method can include providing a cross-shaped resist dispenser including a plurality of resist dispense nozzles; dispensing photoresist material through the plurality of resist dispense nozzles to an integrated circuit wafer; and rotating at least one of the cross-shaped resist dispenser and the integrated circuit wafer.

Another exemplary embodiment is related to a method resist dispensing system used in the dispensing of photoresist material on a wafer in an integrated circuit fabrication process. This system can include a wafer supporting structure which supports a wafer; and a cross-shaped platter having a plurality of dispensing nozzles for dispensing resist material on the wafer.

Another embodiment is related to an apparatus for coating a substrate with a soluble material. This apparatus can include a spin chamber; a cross-shaped dispenser located in the spin chamber, the cross-shaped dispenser having a plurality of dispensing nozzles; a substrate support which locates a substrate within a proximity distance of the cross-shaped dispenser; and means for spinning the substrate such that the soluble material is distributed about the substrate.

Other principle features and advantages of the present invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF EXEMPLARY EMBODIMENTS

Figure 1:
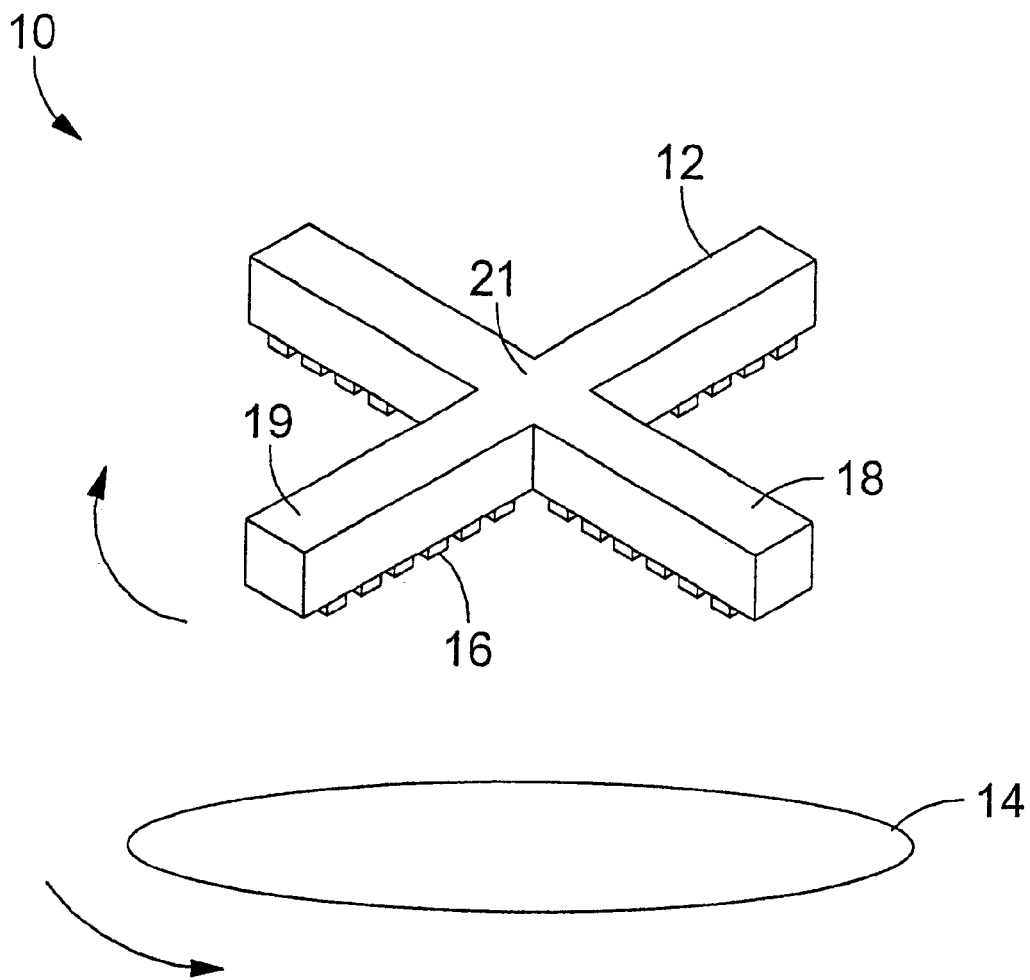
FIG. 1 is a perspective view of a photoresist dispensing system in accordance with an exemplary embodiment.

Referring to FIG. 1, a photoresist dispensing system 10 includes a cross photoresist dispenser 12 and an integrated circuit (IC) wafer 14. As used in this application, the term wafer refers to any substrate used in IC fabrication processes or layer above such a substrate. The substrate or layer above can be conductive, semiconductive, or insulative.

Cross photoresist dispenser 12 is generally comprised of a first rectangular member 18 and a second rectangular member 19. Members 18 and 19 preferably occupy the same plane and are integrally joined at a center point 21. Alternatively, member 18 can be disposed above member 19 or vice versa. Members 18 and 19 are preferably the same size in length, width, and height. Alternative shapes or configurations for cross photoresist dispenser 12 are possible, including cross shaped dispensers where the angle between members 18 and 19 is not 90 degrees. Generally, cross photoresist dispenser 12 can have a similar length to the diameter of wafer 14.

In an exemplary embodiment, cross photoresist dispenser 12 can be described as a cross like apparatus including hundreds (or possibly thousands) of photoresist dispense nozzles 16 directed downward to IC wafer 14. In an exemplary embodiment, the length of members 18 and 19 of cross photoresist dispenser 12 is substantially similar to the diameter and shape of IC wafer 14. For example, the length of members 18 and 19 of cross photoresist dispenser 12 is 200 mm. Photoresist material is provided to cross photoresist dispenser 12, which preferably rotates in the opposite direction of the rotation of IC wafer 14 while dispensing photoresist material onto IC wafer 14.

According to other embodiments, the size of cross photoresist dispenser 12 can vary. For example, if wafer 14 is a 6 inch wafer, dispenser 12 has members 18 and 19 with lengths of 150 mm. If wafer 14 is a 3 inch wafer, members 18 and 19 can have lengths of 75 mm. If wafer 14 is a 10 inch wafer, members 18 and 19 can have lengths of 250 mm. Generally, members 18 and 19 can have lengths of slightly smaller or the same as the diameter of wafer 14 with which it is used. Dispenser 12 (including members 18 and 19) can be either the same diameter/length or 2 to 5 percent smaller than wafer 14.

In an exemplary embodiment, dispense nozzles 16 are separated from each other by a distance of 1 mm on center. In alternative embodiments, dispense nozzles 16 are separated by a distance of 0.5 mm. Dispense nozzles 16 can have a width of 0.2 mm for a 0.5 mm separation. Alternatively, dispensing nozzles 16 can have a width of 0.5 mm for a separation of 1 mm to 2 mm. In an exemplary embodiment, cross photoresist dispenser 12 has over 10,000 dispensing nozzles 16.

Preferably, one nozzle is centered at the center of wafer 14 to insure coating of center portion of wafer 14. The pattern of nozzles 16 is circular to match wafer 14. The size of each nozzle can be 500 micrometers ($\mu$m). Nozzles 16 are large enough to allow photoresist material to easily pass yet small enough to avoid excessive puddling on wafer 14.

During conventional photoresist spin coating processes, a large percentage of photoresist is wasted. Conventional spin coating processes have a single pipe or nozzle which deposits a puddle of photoresist material onto a wafer. The puddle of photoresist material is distributed by spinning the IC wafer. Much of the photoresist material from the puddle is spun off the IC wafer. Furthermore, the resist thickness uniformity is hard to control using conventional single nozzle or pipe systems. Thickness uniformity is particularly hard to control on topographic patterns with conventional photoresist coating processes.

Advantageously, cross photoresist dispenser 12 greatly reduces the photoresist consumption and improves the overall photoresist thickness uniformity. Conventional photoresist spin coating processes deposit a puddle of photoresist material on an IC wafer which is then distributed over the wafer by spinning the wafer. Cross photoresist dispenser 12, advantageously, deposits a smaller amount of photoresist material than is deposited using the conventional single nozzle photoresist dispenser. As such, less resist is needed to cover the whole wafer.

Figure 2:
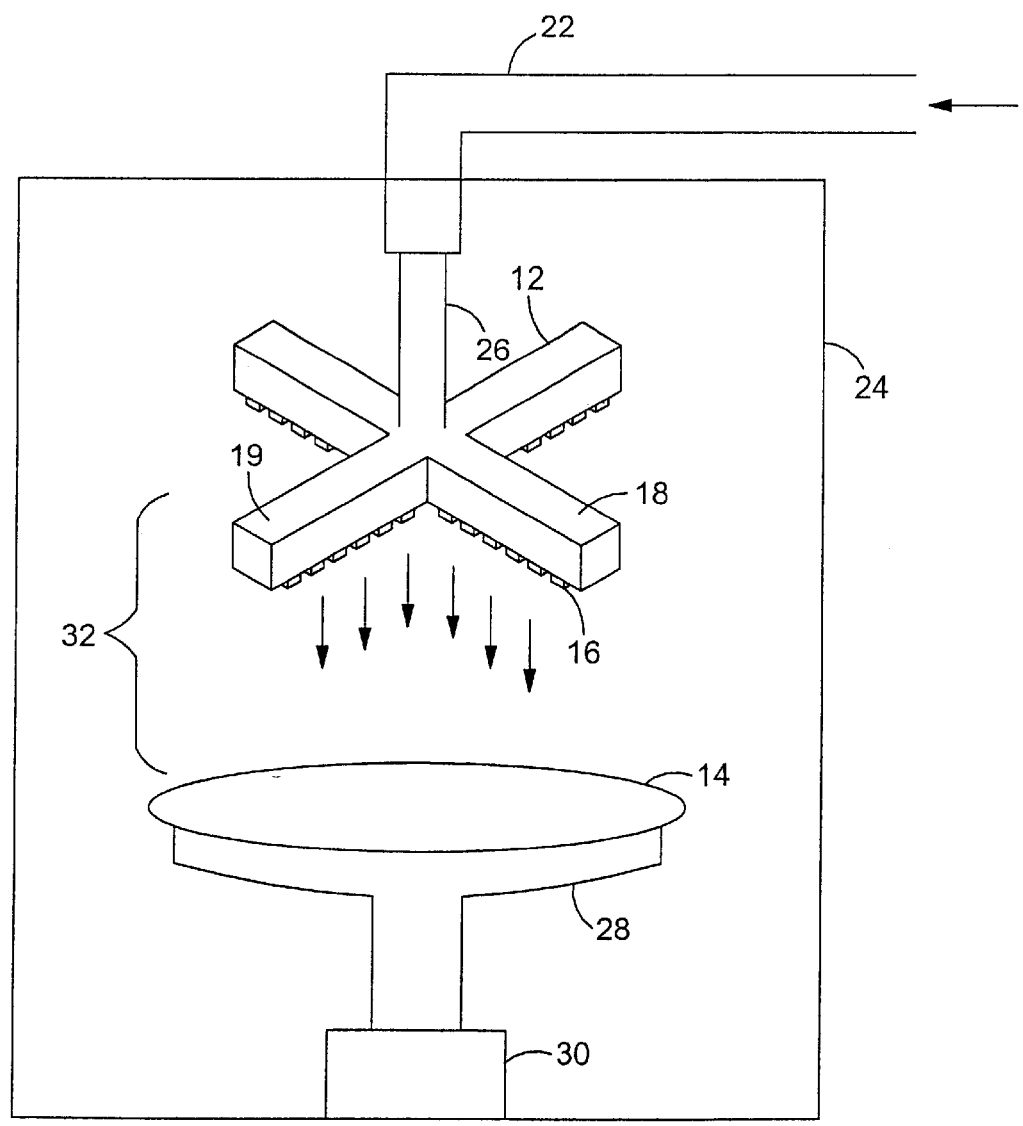
FIG. 2 is a representation of a spin chamber configured to dispense photoresist on a wafer in accordance with an exemplary embodiment.

Referring now to FIG. 2, photoresist material is introduced through a channel 22 to cross photoresist dispenser 12. Channel 22 introduces photoresist material to a spin chamber 24. In an exemplary embodiment, cross photoresist dispenser 12 is coupled to a rotatable member 26 and IC wafer 14 is located on a substrate support 28 which is coupled to a rotatable member 30. During the dispensing of the photoresist material, cross photoresist dispenser 12 can be rotated while IC wafer 14 is rotated. In an exemplary embodiment, cross photoresist dispenser 12 spins in an opposite direction as the rotation of IC wafer 14.

Photoresist material passes from cross photoresist dispenser 12 through dispense nozzles 16 to IC wafer 14. Cross photoresist dispenser 12 is separated from IC wafer 14 by a distance 32. In an exemplary embodiment, distance 32 is 0.5 mm. Advantageously, the puddles of photoresist material formed on IC wafer 14 from dispense nozzles 16 are smaller in size than the puddle of photoresist material dispensed from conventional single nozzle or pipe photoresist dispensing systems. In an exemplary embodiment, puddles of photoresist material on IC wafer 14 from dispense nozzles 16 are 2 mm in size. The multiple puddles of photoresist material are dispensed about IC wafer 14 by the spinning motion of IC wafer 14.

Once photoresist material is disposed on IC wafer 14, photoresist material is dried. In an exemplary embodiment, photoresist material is dried by a baking process in spin chamber 24.

In an exemplary embodiment, circular wafer 14 has a diameter of 200 mm. The target photoresist thickness is chosen to be 1 $\mu$m as an example. With this photoresist thickness, the range of dispensed photoresist thickness before high-speed spin is 3 $\mu$m to 5 $\mu$m. A 3 $\mu$m to 5 $\mu$m dispensed resist thickness requires 0.05 ml to 0.09 ml of resist respectively per 8 inch wafer. Comparing with conventional techniques requiring at least 3.5 ml of resist, a 65× to 40× saving of resist material is realized for the 3 $\mu$m to 5 $\mu$m thick dispensed thickness, respectively.

The size of dispense nozzles 16 is chosen to be sufficiently small that surface tension of the liquid resist prevents it from dripping. Yet, dispense nozzles 1 6 are chosen to be sufficiently large to facilitate dispense nozzles 16 fabrication and to prevent too much surface tension which hinders dispensing. In an exemplary embodiment, nozzles 16 have a size as to hold the resist when there is no pressure, but when pressure is applied, tiny jets or streams of resist come out of nozzles 16. The usable range of dispense nozzles 16 size is between 0.1 mm and 2 mm. Whereas, the preferred range is between 0.2 mm and 0.5 mm. Dispense nozzles 16 are located as close as physically permitted to each other. The nozzle-to-substrate proximity distance ranges from 500 $\mu$m to 10 mm.

Preferred slow spin speed ranges from 0.1 to 100 rpm. High-speed spin ranges from 500 to 20,000 rpm. The preferred liquid resist dispense time is between 1 and 10 seconds. Using a dispense time of 3 seconds while the substrate support 28 rotates at 20 rpm, the resist flow rate is 0.017 ml/sec for a 3 μm dispensed resist thickness or 0.03 ml/sec for a 5 μm dispensed thickness.

While the embodiments illustrated in the FIGURES and described above are presently preferred, it should be understood that these embodiments are offered by way of example only. Other embodiments may include, for example, different spinning techniques as well as different mechanisms to dispense photoresist onto cross resist dispenser 12. Further, other embodiments may utilize the methods and systems described to dispense any soluble material. The invention is not limited to a particular embodiment, but extends to various modifications, combinations, and permutations that nevertheless fall within the scope and spirit of the appended claims.

What is claimed is:

1. A method of depositing photoresist material on an integrated circuit wafer comprising:

providing a cross-shaped resist dispenser including a plurality of resist dispense nozzles;

dispensing photoresist material through the plurality of resist dispense nozzles to an integrated circuit wafer; and rotating at least one of the cross-shaped resist dispenser and the integrated circuit wafer.

2. The method of claim 1, wherein the step of rotating at least one of the cross-shaped resist dispenser and the integrated circuit wafer comprises rotating both the cross-shaped resist dispenser and the integrated circuit wafer.

3. The method of claim 2, wherein the cross-shaped resist dispenser rotates in the opposite direction of the rotation of the integrated circuit wafer.

4. The method of claim 1, wherein the cross-shaped resist dispenser includes a resist dispense nozzle for every 0.25 to 4 square mm of area.

5. The method of claim 1, wherein the length of the cross-shaped resist dispenser is substantially equal to the diameter of the integrated circuit wafer.

6. A method of dispensing photoresist material on a wafer in an integrated circuit fabrication process, the method comprising:

providing a wafer supporting structure which supports an integrated circuit wafer;

providing a cross-shaped platter having a plurality of dispensing nozzles for dispensing resist material on the integrated circuit wafer;

dispensing photoresist material through the plurality of dispensing nozzles to the integrated circuit wafer; and rotating the cross-shaped platter.

7. The method of claim 6, further comprising rotating the wafer supporting structure.

8. The method of claim 6, wherein the length of the cross-shaped platter is substantially equal to the diameter of the integrated circuit wafer.

9. The method of claim 6, wherein the plurality of dispensing nozzles are separated from each other by a distance of 0.5 to 2 millimeters (mm).

10. The method of claim 6, wherein the cross-shaped platter has a diameter of 150 mm or 300 mm.

11. The method of claim 6, wherein the wafer supporting structure is configured to be selectively rotated.

12. The method of claim 6, wherein the dispensing photoresist material step produces a dispensed photoresist thickness of 3 micrometers (μm) to 5 μm.

13. A method of coating a substrate with a soluble material, the method comprising:

dispensing a soluble material from a cross-shaped dispenser located in a spin chamber, the cross-shaped dispenser having a plurality of dispensing nozzles;

providing a substrate support which locates a substrate within a proximity distance of the cross-shaped dispenser; and spinning the substrate such that the soluble material is distributed about the substrate.

14. The method of claim 13, further comprising spinning the cross-shaped dispenser.

15. The method of claim 14, wherein spinning the cross-shaped dispenser spins the cross-shaped dispenser in a direction opposite to the direction of the substrate.

16. The method of claim 13, wherein the cross-shaped dispenser has a diameter of 150 mm to 300 mm.

17. The method of claim 13, wherein the plurality of dispensing nozzles are separated by a distance of 0.5 mm to 2 mm.

18. The method of claim 13, wherein the soluble material is a resist material.

19. The method of claim 13, further comprising drying the soluble material.

20. The method of claim 13, wherein the plurality of nozzles are 0.1 mm to 2 mm in width.

\* \* \* \* \*